United States Patent [19]
Bergman et al.

[11] Patent Number: 4,878,142
[45] Date of Patent: Oct. 31, 1989

[54] HIGH RESISTANCE GROUND FAULT PROTECTION

[75] Inventors: Sten Bergman; Stefan Ljung, both of Västerås, Sweden

[73] Assignee: ASEA Brown Boveri AB, Västerås, Sweden

[21] Appl. No.: 241,370

[22] Filed: Sep. 7, 1988

[30] Foreign Application Priority Data

Sep. 16, 1987 [SE] Sweden .............................. 8703580

[51] Int. Cl.$^4$ ............................................. H02H 3/26
[52] U.S. Cl. ...................................... 361/80; 361/82; 361/84; 324/509; 324/522; 324/525; 364/483
[58] Field of Search ............................ 361/65, 79–85, 361/76; 324/509, 512, 521, 522, 525; 364/481–484

[56] References Cited

U.S. PATENT DOCUMENTS

| | | | |
|---|---|---|---|
| 3,614,534 | 10/1971 | Gross . | |
| 4,091,433 | 5/1978 | Wilkinson | 361/76 |
| 4,148,087 | 4/1979 | Phadke | 361/80 |
| 4,261,038 | 4/1981 | Johns et al. | 324/525 X |
| 4,352,137 | 9/1982 | Johns | 361/82 |
| 4,719,580 | 1/1988 | Nimmersjo | 364/483 |
| 4,731,689 | 3/1988 | Nimmersio et al. | 324/522 X |
| 4,795,983 | 1/1989 | Crockett et al. | 324/509 X |

FOREIGN PATENT DOCUMENTS 2012505 7/1979 United Kingdom .

OTHER PUBLICATIONS

Yang et al.; "Microprocessor-Based Algorithm for High-Resistance Earth-Fault Distance Protection"; IEEE Proceedings, vol. 130, pt. C, No. 6, Nov. 1983, p. 306.
Balser et al.; "A Microprocessor-Based Technique for Detection of High Impedance Faults"; IEEE Tans. on PWRD, vol. PWRD-1, No. 3, Jul. 1986, pp. 252–258.
Thorp et al.; "Limits to Impedance Relaying"; IEEE Trans. on Pas, vol. PAS-98, No. 1, Jan./Feb. 1979, pp. 240–260.
Girgis et al.; "A New Filtering Based Digital Distance Relay"; IEEE Trans. on PAS, vol. PAS-101, No. 9, Sep. 1982, pp. 3471–3780.
Phadke et al.; "Fundamental Bases for Distance Relaying with Symmetrical Components"; IEEE Trans. on PAS, vol. PAS-96, No. 92, Mar/Apr. 1977, pp. 635–646.
Aucoin et al.; "Distribution High Impedance Fault Detection Utilizing High Frequency Current Components"; IEEE Trans. on Power Apparatus and Systems, vol. PAS-101, No. 6, Jun 1982, pp. 1596–1606.
Rao et al.; "Study of Symmetrical and Related Components Through the Theory of Linear Vector Spaces"; IEEE 113, Jun. 1966, pp. 1057–1062.
Dommmel et al.; "Computation of Electromagnetic Transients"; IEEE, vol. 62, Jul. 1974, pp. 983–993.

Primary Examiner—Todd E. Deboer
Attorney, Agent, or Firm—Watson, Cole, Grindle & Watson

[57] ABSTRACT

A protection device for high resistance ground faults in a power network according to the invention has a fault detection principle which is based on an indirect study of non-harmonic frequency components of the phase currents. When such a fault has occurred, a considerable change of the energy contents of these frequencies arises. This change can be detected by a device according to the invention. If by comparison (4e) between digitized input signals (I') and a harmonic Fourier model (4d) of the same signals, i.e. generation of the residuals of the system, it is found that a difference exists, and if the corresponding loss function $V_N$(4f) for a certain time exceeeds a lower limit value - all on condition that a zero sequence current ($I_O$) exists - then there is a high resistance ground fault on any of the phases of the network.

3 Claims, 2 Drawing Sheets

HIGH RESISTANCE GROUND FAULT PROTECTION

TECHNICAL FIELD

The present invention relates to a protection device for high resistance ground faults in networks for distribution or transmission of electric power.

The type of fault that is intended by the phrase "high resistance faults" occurs, for example, when a tree has fallen over the conductor and arcing arises as a result of sparkover to the vegetation, or it may be a question of a broken or fallen primary conductor which is brought into contact with the ground and thereby causes a ground fault state.

Because of the high contact resistance which normally exists during faults of the above kind, the fault current is small and therefore often negligible. This also means that it will be difficult to reliably separate such faults from large changes of the load. A consequence of this is that a high resistance fault may remain during a long period of time and lead to fire hazard or other hazard to humans who come into contact with or are in the vicinity of the conductor. Usually, this type of fault is discovered during the continuous routine inspection of the conductor.

BACKGROUND ART, THE TECHNICAL PROBLEM

Ever since the childhood of electrical engineering, it has been a desire to be able to detect the type of fault described above. Consequently, there are a large number of different principles for solving the technical problem. One of the reasons for this is that the neutral point of the networks in relation to ground is treated in different ways. Keeping pace with the general technical development, the technical solutions to this problem have also undergone great changes. Previous classical, analog solution principles have nowadays given way to more or less sophisticated solutions based on computer technique, approximation of measured signal values to mathematical functions, estimation of parameters included, numerical technique and statistical methods.

The state of the art will therefore be described on the basis of the protection devices which have been developed during the last few years, based on computer technique.

It is self-evident that it is desired to be able to detect as great high resistance ground faults as possible. By pure definition, the limit to what may be considered a high resistance fault seems to be somewhat vague. This is a consequence partly of the limits that are detectable in practice and partly of the additional requirements which are often placed on these protection devices. In addition to the desire to detect a high resistance fault, it is also desired to know in what direction a fault is located in relation to an outgoing measuring station and, if possible, the distance to the site of the fault.

The types of faults described above often give rise to ground fault resistances of the order of magnitude of 5-10 k $\Omega$. However, in IEEE Proceedings, Vol. 130, pt. C, No. 6, November 1983, page 306, in an article entitled "Microprocessor-Based Algorithm for High-Resistance Earth-Fault Distance Protection", Yang, Morrison and Eng state that a maximally allowed upper limit to a ground fault is 200 $\Omega$ if it is also desired to determine the distance to the fault.

In an article entitled "A Microprossor-Based Technique for Detection of High Impedance Faults" by Balser, Clements and Lawrence, published in IEEE Trans. on PWRD, Vol. PWRD-1, No. 3, July 1986, it is stated, however, that a fault representing a considerably higher resistance can be discovered. This indicates that it should be simpler to discover a fault but that it is problematic to find a model which enables the determination of the distance to the fault.

For a protection device that is intended to react to low-ohmic faults, the problem of protection can be approached from essentially two different points of view. From the first one a physical model of the system to be protected is used. This can be set up by applying Kirchhoff's laws. This leads to a relation between the different currents and voltages in the form of impedance and admittance matrices for the system. In an article by Thorp, Phadke, Horowitz and Beehler entitled "Limits to Impedance Relaying", published in IEEE Trans. on PAS, Vol. PAS-98, No. 1, Jan/Feb 1979, pp. 240-60, it has been described, however, that there are considerable limitations to structures which are based on impedance models.

In the second model, knowledge of the structure of the signals in the system is used to adapt some function to the measured values. This can be carried out by approximating the signal with a combination of mathematical functions. In, for example, an article entitled "A New Filtering Based Digital Distance Relay" by Girgis, published in IEEE Trans. on PAS, Vol. PAS-101, No. 9, September 1982, pp. 3471-80 and in an article entitled "Fundamental Bases for Distance Relaying with Symmetrical Components" by Phadke, Ibrahim and Hlibka in IEEE Trans. on PAS, Vol. PAS-96, No. 92, March/April 1977, pp. 635, 46, each individual signal is represented by truncated Fourier series. When successively measured values exist, the coefficients of the signal can be estimated by applying recursive algorithms. However, when the fault impedance has a large amount, problems may arise in discovering the differences between the different phase quantities. This is mostly due to the limited resolution in the implementation with a limited word length. Owing to this fact, there are advantages in estimating the Fourier components for a suitable combination of the current quantities instead of the individual phase quantities.

Protection devices which are designed to operate when high resistance ground faults arise are patented in several different designs. Most conventional methods which are used in existing patents for high resistance ground faults are based on impedance models for the transmission line. This may be a doubtful philosophy of approach since impedance for sinusoidal signals is really only defined for stationary phenomena. During the transient stage after a fault, on the other hand, the information is limited and it may therefore be difficult to carry out the analysis in the impedance plane. The measurement errors which arise in high resistance ground faults are therefore particularly pronounced. The disadvantages of the impedance plane analysis have been described by Phadke, Ibrahim and Hlibka in the article cited above.

One way of avoiding the problems mentioned above has been investigated by analog implementation in the U.S. Pat. No. 4,352,137 entitled "Method and Device for Fault Detection", which describes a method which is based on utilizing the propagation of travelling waves over the transmission line. Such algorithms manage to treat the transient phenomena but must be complemented with conventional distance and overcurrent relays to be able to be applied during stationary conditions. The effectiveness of the concept thus obtained has proved to be considerably higher than in corresponding impedance methods. However, since the method is, in principle, a transient-sensing method, it may be hazardous to base a decision about extremely great high resistance faults on this method.

British Pat. No. 2012505 entitled "Protective Relaying Apparatus" and U.S. Pat. No. 3,963,964 entitled "Phase Comparison Relay for Protecting a Line Section of a Multi-Phase Power Transmission Network" describe protective devices for high resistance ground faults which are based on a comparison of the phases at the two end points of a protected section of a transmission line.

U.S. Pat. No. 4,091,433 entitled "Protective Relay Circuit for Interphase Faults" describes a device based on the study of symmetrical components instead of on the phase quantities themselves.

U.S. Pat. No. 3,614,534 entitled "Electrical Protective Systems" and Canadian Pat. No. 946,928 entitled "Ground Fault Detector and Circuit Interrupter by Magnetic Flux Storage Method" describe devices in which the error signals are stored in the form of a magnetic flux in an inducing core. The described method seems to operate satisfactorily for a fault resistance of the order of magnitude of 2 k $\Omega$.

As is clear from the above, quite a large number of patents have been granted for devices which are intended to discover high resistance ground faults. However, most of them are impedancebased and/or have a discriminating portion which has been implemented using analog technique. In other respects, the standards for how high fault resistance that can be managed have changed over the years. It is of the utmost interest to be able to handle as high fault resistances as possible. For this purpose, new methods are required, above all when it comes to the analyzing part of the relay unit.

A description of the state of the art as regards protection for high resistance faults cannot necessarily be considered complete without briefly mentioning two major long-term research projects in the USA, dealing with high impedance ground faults. One of the projects is being carried on at Texas A&M University by order of The Electric Power Institute. An account of this project work is published in IEEE Trans. on power Apparatus and Systems, Vol. PAS-101, No. 6, June 1982, pp. 1596-606 and is entitled "Distribution High Impedance Fault Detection Utilizing High Frequency Current Components", written by Aucoin and Russel. This projects has been going on for many years and the object has been to investigate the properties of real high impedance fault. Analyses have been made of data gathered from faulted conductors. The detection logic is based on analyzing the energy which is present in frequency components of the current of a higher order. To this end, FFT analysis is applied to obtain the properties of the studied signals from the distribution line. In this connection, individual peaks representing noise are disregarded, and the main interst is concentrated on indicating the cumulative effect of many such peaks during a short period of time.

Extensive investigations have been carried out through offline simulation of collected data. A prototype has also been produced for verifying the methods used in real time. This is based on data being collected with a frequency of 2-10 kHz during one period. These data are then processed with the algorithm which has been produced by simulation studies.

The second project is being conducted at The Electric Power Institute as an independent work. Also in this case extensive analyses of collected data from distribution lines in the field have been performed. It has been found that high resistance faults can be classified into two groups, namely, passive and active. The former originates from such situations where a conductor has broken and thus causes an unbalance in the current which is measured at a substation. The latter type of fault arises when a conductor comes into contact with conducting material and arcing arises. In this case the unbalance occurs not only in the basic component but also in the different harmonic components and primarily in the odd harmonics. The detection algorithm is thus based on first calculating the Fourier coefficients for the 1st, 3rd and 5th harmonic phase currents. Thereafter, normalized sequence currents for each harmonic component are calculated. The covariance matrix for the estimations and a statistical test quantity are produced as a basis for the logic handling. In this method, a matrix of the same order of magnitude as the number of estimated parameters is updated. In addition, it is necessary to invert the covariance matrix. These are time-demanding procedures as far as the CPU is concerned, which has a negative effect on the highest sampling frequency that may be selected. In the present situation, therefore, no economically realistic implementation of this algorithm exists.

A very important and integral part of the invention which will now be described is that a concept, which is described in detail in U.S. patent application 212,225 entitled "Frequency relay", can also be used, after extension, in a protection device for high impedance faults. The concept according to the aforementioned U.S. application comprises converting a measured signal, obtained from the network, after filtering and digitization, into an analytical model in the form of a truncated Fourier series, the coefficients of which are determined in a parameter estimator operating with an estimation method in accordance with the least squares method. Starting from model values, according to the concept, calculation of the frequency can be carried out in a frequency estimator, whose output signal, on the one hand, is returned as current frequency value to the parameter estimator and, on the other hand, is a measure of the current frequency, for example for determining the limits to permissible frequency variations.

Since the parameter estimation technique is an important and integral part of the invention and since concepts from this technique will be used to describe the invention, a brief summary thereof, based on the technique as described in U.S. patent application 212,225, will be given. Current signals can be modelled by:

$$y(t) = a_0 \exp(-b_0 t) + \sum_{1}^{N} c_j \sin(\omega_j + d_j) \quad (1)$$

which can be transformed to $$y(t) = \theta^T \psi(t) \quad (2)$$

where
$$\theta^T = (a_0, -a_0 b_0, c_1 \cos d_1, c_1 \sin d_1, \ldots c_N \cos d_N, c_N \sin d_N) \quad (3)$$

is a parameter estimation vector and $$\psi(t) = (1, t, \sin \omega_0 t, \cos \omega_0 t, \ldots \sin N\omega_0 t, \cos N\omega_0 t) \quad (4)$$

is a regressive vector.

Estimation of the parameters according to the least squares method means that the value of a "loss function" $V_N$ is minimized.

This loss function is a measure of the energy of the deviation between actual signal and model signal during an exponential time window backwards from the current point in time t. The contribution to the loss function of the previous instantaneous model deviations of the signal is controlled with the foregetting of the interval $\lambda$, which is usually selected in the interval 0.9 to 1.0. Thus, the least squares adaptation aims at minimizing the deviation, which is the same as selecting an adequate model order. $V_N$ can be written as $$V_N(\lambda, t) = \sum_{j=1}^{t} \lambda^{t-j} \epsilon^2(j) = \lambda \cdot V_N(\lambda, t-1) + \epsilon^2(t) \quad (5)$$

where $\lambda$ is a forgetting factor and where $\epsilon(t)$ is an estimation error function.

The minimization gives the following equation for $\theta(t)$ $$\theta(t) = \quad (6)$$

$$\left[ \lambda^t P^{-1}(0) + \sum_{j=1}^{t} \lambda^{t-j} \psi(j) \psi^T(j) \right]^{-1} \left[ \sum_{j=1}^{t} \lambda^{t-j} \psi(j) y(j) \right]$$

The actual estimation is performed recursively with the aid of the following algorithm $$R(t) = \lambda \cdot R(t-1) + \psi(t)\psi^T(t) \quad (7)$$

$$R(0) = \delta \cdot I \quad (8)$$

$$R(t)L(t) = \psi(t) \quad (9)$$

$$y(t) = \theta^T(t-1)\psi(t) \quad (10)$$

$$\epsilon(t) = y(t) - y(t) \quad (11)$$

$$\theta(t) = \theta(t-1) + L(t)\epsilon(t) \quad (12)$$

Here, R(t) is the covariance matrix of the regression vector and P(t), as shown below, is the inverse thereof. Otherwise, the following recurrence formulas will be used:

$$r(t) = P(t-1)\psi(t) \quad (13)$$

$$d(t) = \lambda + \psi^T(t)r(t) \quad (14)$$

$$L(t) = r(t)/d(t) \quad (15)$$

$$P(t) = (P(t-1) - r(t)L^T(t))/\lambda \quad (16)$$

$$P(0) = (1/\delta) \cdot I \quad (17)$$

$$\theta(0) = \theta_0 \quad (18)$$

Another concept, also belonging to the prior art, will be used with the invention now described. For reasons which will be given later on, modal transformations will be applied. Such transformations are described, inter alia, in Proceedings IEEE 113, June 1966, in an article entitled "Study of symmetrical and related components through the theory of linear vector spaces", as well as in the U.S. Pat. No. 4,719,580 entitled "Line protection". In the present invention the possibilities of transforming phase signals to corresponding symmetrical components by an orthogonal transformation matrix are utilized.

The object of the invention is to provide a more sensitive protection device for extremely high resistance faults than what is possible to achieve using the present technique. In this connection it is an important desire that a tripping signal should not be delivered for unbalanced load currents which originate from unsymmetrical loads. In addition to the protection device being transient sensing, therefore, the invention also comprises a method whereby stationary states are taken into consideration by carrying out static analysis. To this are to be added the usual advantages of numerical technique as compared with pure analog implementation of the relay concept.

DISCLOSURE OF THE INVENTION

Figure 1:
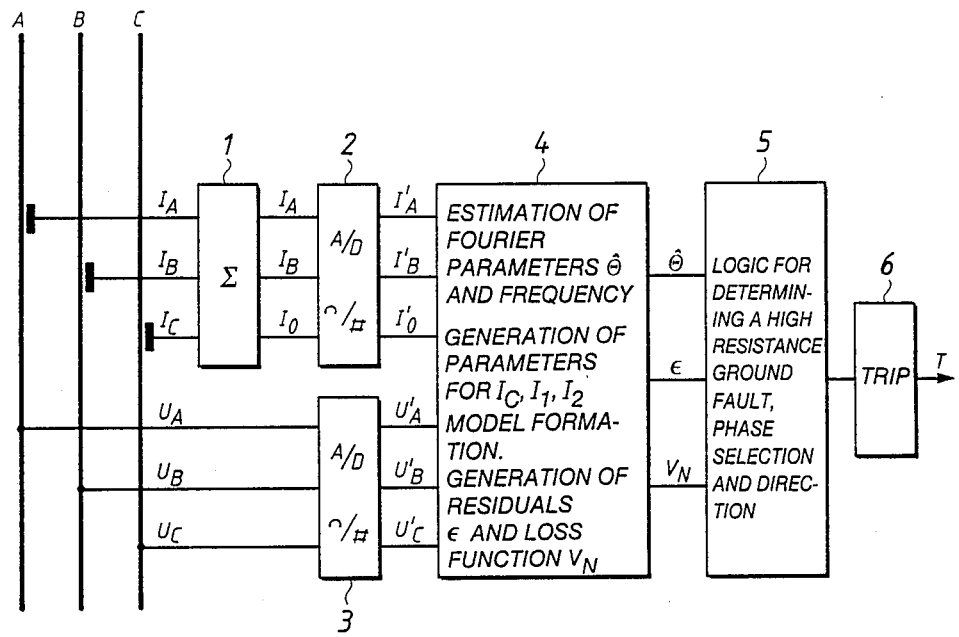
FIG. 1 shows a preferred structure of a protection device, from the hardware point of view, for high resistance ground faults.

It has been found to be difficult to distinguish a faultless line system from a faulted line system. However, it has been proved that there is a considerable difference in the harmonic content of the phase currents between a faultless and a faulty state. In the case of high resistance faults, the current signals contain a wide spectrum of different frequency components. It has also been proved that the magnitude of, or - as it can also be expressed - the energy contents of non-harmonic current components, increases by about one hundred times from a faultless line state to a faulty state caused by a high resistance ground fault. In a faultless state and independently of the magnitude of the load, the non-harmonic current signal components are completely negligible. In a faultless state, however, the load signals have contents of harmonic frequencies.

Upon a change of load, transients occur on the current signals, which transients disappear in the course of a few cycles. The non-harmonic frequencies which originate from high resistance ground faults have a longer duration than the harmonic frequencies occurring upon load changes.

To sum up, thus, a fault detection principle for high resistance ground faults can be based on the study of non-harmonic frequency components of the current. As has been established, a high resistance ground fault exists on the line when a considerable change or increase in the energy contents of non-harmonic frequencies can be observed and when this change or increase remains at least for a few seconds.

However, there will always be a certain uncertainty in the distinction between high resistance ground faults and load changes. It is therefore suitable to use statistical methods for increasing the probability of accurate detection.

The Fourier component estimation which is described in U.S. patent application Ser. No. 212,225 together with appropriate logic handling, is well adapted to discover faults when the fault impedance is of the order of magnitude of a few hundred ohms. However, when a high resistance fault of a few thousand ohms occurs, such a fault situation cannot be distinguished, using this technique, from the noise that arises as a result of the algorithm used in U.S. application Ser. No. 212,225 being implemented with a limited word length. One way of avoiding this problem is to work with symmetrical current components by modal transformation, i.e. with zero sequence, positive sequence and negative sequence components. These quantities can be obtained from the phase quantities by a transformation with the aid of an orthogonal transformation matrix. Several such matrices are available. Some of these, however, introduce complex arithmetics which renders the further processing difficult. However, according to a transformation proposed in a paper entitled "Computation of Electromagnetic Transients", by Dommel and Meyer, published in Proc. IEEE, Vol. 62, July 1974, pp. 983-993, the good properties of the symmetrical sequence quantities are retained. This transformation is exemplified here for the phase currents $I_A$, $I_B$, and $I_C$ according to the following $$\begin{bmatrix} I_0 \\ I_1 \\ I_2 \end{bmatrix} = \frac{1}{3} \begin{bmatrix} 1 & 1 & 1 \\ 1 & -1 & 0 \\ 1 & 0 & -1 \end{bmatrix} \begin{bmatrix} I_A \\ I_B \\ I_C \end{bmatrix}$$

From this matrix it is clear that the modal component $I_0$, i.e. the zero sequence current, can be obtained as the mean value of the phase quantities. This mean value can, of course, also be obtained directly upon measuring, which means that the hardware implementation of the protection device for high impedance ground faults is facilitated.

When a symmetrical load is connected to a line, the mean value $I_0$ is practically zero. A detected zero sequence current may either be due to an unsymmetrical load on a faultless line system, or to a faulted state. The previously described fault detection principle is therefore applied, although in an indirect manner as will be described in more detail below, to the zero sequence current.

After the occurrence of a high resistance fault, the zero sequence current will exhibit a periodic behaviour, which makes it possible to make a Fourier expansion of the current signal into fundamental frequency and harmonic components. After the occurrence of a fault, the zero sequence current substantially consists of the fundamental frequency and some contribution from the third and fifth harmonics. However, these harmonic contents are negligible compared with the fundamental frequencies and can be filtered out, for example by taking account of them in the selected model.

The logic that is now needed to detect a high resistance fault is based on the study of the Fourier coefficients of $I_0$. First it should be determined whether there is asymmetry, i.e. whether there is an $I_0$ exceeding a certain lower level $v$. If this is the case for a longer period of time, either the system has become unsymmetrical or something unusual has occurred. To find out which of these alternatives is true, a study can be performed of the loss functions $V_N$ and the instantaneous residuals in the estimation of $I_0$, as described in U.S. application Ser. No. 212,225. As mentioned previously, $I_0$ can be measured as a combination of the phase currents, whereupon it is available after conversion to digital representation to form part of the decision data. The instantaneous residuals consist of the difference between the measured and the A/D converted measured signal for $I_0$ and the signal obtained by the truncated Fourier series expansion. If, after a zero sequence current has been detected, the generated Fourier model is the correct reproduction of the measuring signal, the instantaneous residuals and hence the loss function will exhibit small values, i.e. an asymmetry caused by load asymmetry exists.

If, for a certain time $\Delta t$, the loss current $V_N$ exceeds a certain value $\eta$ with a duration greater than, for example, $t_F$, this must be due to the selected Fourier model, based on harmonic components, not correctly reproducing the measured signal. This, in turn, can only be due to the measured signal for $I_0$ having a not-significant content of non-harmonic frequencies, i.e. a high resistance ground fault exists on the line. In addition, it is possible to study the magnitude of the harmonics via corresponding coefficients.

The protection of high resistance ground faults should conveniently also comprise the determination of the faulted phase as well as the direction to the fault.

Phase selection can suitably take place by the study of estimated Fourier components for the phase currents. Since estimated Fourier components for $I_0$ must be available for the phase detection technique, it is sufficient to estimate the components for two of the phase currents, for example $I_A$ and $I_B$, since estimated components for the third phase current can simply be obtained as $$I_C = 3I_0 - I_A - I_B$$

If the protection device is only intended to detect high resistance ground faults, it is not necessary to calculate $I_1$ and $I_2$. if the protection device should also be capable of detecting low resistance faults, it may be advantageous to base the analysis on the other two modal quantities $I_1$ and $I_2$ and these can be supplied in a simple manner by the shown orthogonal transformation matrix.

To obtain as reliable an estimation of the different components as possible, an accurate value of the fundamental frequency in question must be available. This can be conveniently accomplished according to the frequency estimation technique as described in U.S. application Ser. No. 212,225. This means that an estimation of the frequency components must also be performed for the different corresponding phase voltages $U_A$, $U_B$ and $U_C$.

By studying the loss function or amplitude of the current harmonics, it can be determined in what phase a fault has occurred.

The direction to a fault in relation to a measuring station can be determined by studying the polarity of the instantaneous residuals for, for example, the phase currents for a certain period of time.

DESCRIPTION OF THE PREFERRED EMBODIMENTS

To get a good general view of the invention, the embodiment will be described in two different stages. The first stage comprises a suitable structure of the components included from the hardware point of view. The second stage comprises the signal flow paths in a protection device for high resistance ground faults according to the invention.

FIG. 1 shows the large modules which together constitute the invention. Analog signals for phase currents and phase voltages are obtained from the network. In classical conventional manner, with the aid of $I_A$, $I_B$ and $I_C$, the zero sequence current $I_0$ is formed in the summator 1. Conversion to digital quantities $I_A'$, $I_B'$ and $I_0'$ is performed in the A/D converter 2. Conversion of the phase voltages $U_A$, $U_B$ and $U_C$ to corresponding digital quantities $U_A'$, $U_B'$ and $U_C'$ takes place in the A/D converter 3.

The digitized values are processed in the calculating unit 4 to obtain estimated values $\hat{\theta}$ of the Fourier components and the current fundamental frequency. With the technique described above, also estimated components for the phase current $I_C$ and the positive sequence and negative sequence currents are generated. In addition, a determination of the instantaneous residuals $\epsilon$ and the corresponding values of the loss function $V_N$ of the system is performed here.

The estimated and generated components and the residuals and the loss function are supplied to the logic unit 5, in which evaluation is performed in accordance with the fault detection technique described. In this unit, determination of the faulted phase and the direction to the fault is also performed, all according to the method described above.

If a high resistance fault has been detected, a trip output signal T, containing information about the direction to the fault and about the faulted phase, is received via a TRIP signal unit 6, to bring the fault to attention and to clear the same.

Figure 2:
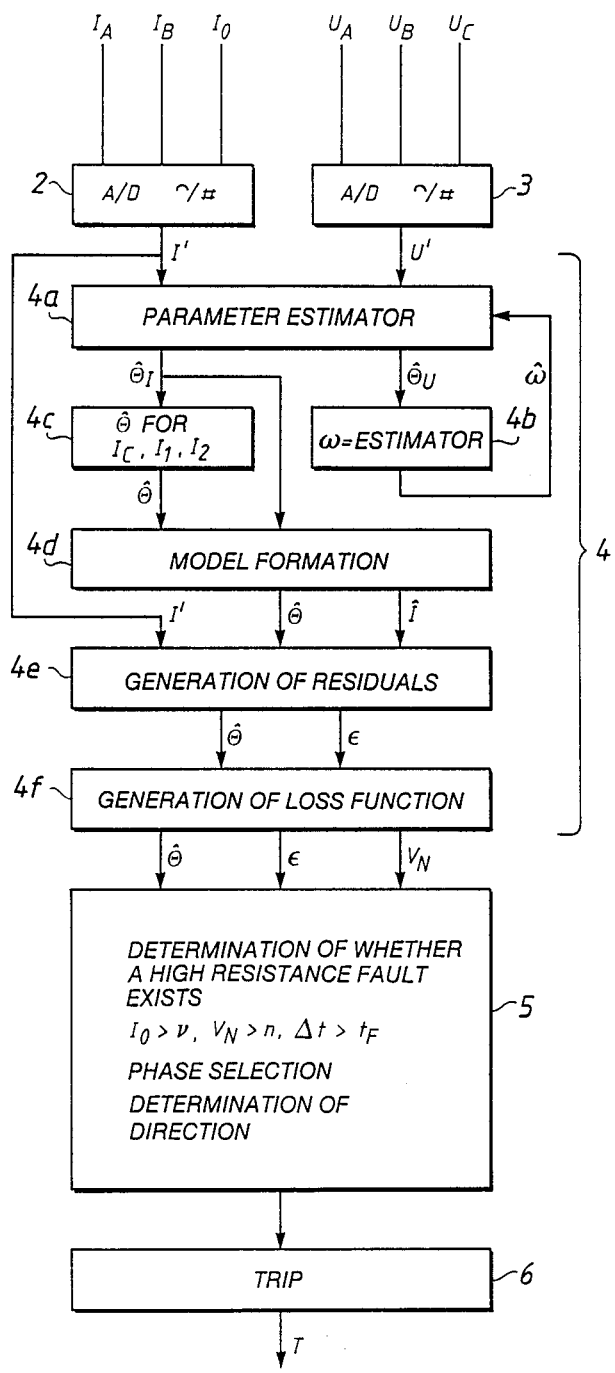
FIG. 2 shows signal flow paths for a protection device for high resistance ground faults according to the invention.

The flow signal chart shown in FIG. 2 has as input signal the analog phase currents $I_A$ and $I_B$ and the zero sequence current $I_0$ and the analog signals for the phase voltages. All of these signals are converted to digital representation in the converters 2 and 3. The calculating unit 4 shown in FIG. 1 has here been divided into its respective constituents to be able to describe the signal paths. Member 4a supplies estimated values $\hat{\theta}_I$ and $\hat{\theta}_U$ of the Fourier components to the incoming digitized current and voltage quantities. The estimated component $\hat{\theta}_U$ is supplied to a frequency estimator 4b, whose frequency value $\hat{\omega}$ is returned to the parameter estimator 4a as a value of the frequency in question.

With the aid of the estimated parameters of the incoming currents, $\theta_I$, estimated parameter values of the phase current $I_C$ and the positive sequence and negative sequence currents, $I_1$ and $I_2$, can be determined in member 4c.

Since now all estimated components are available, a Fourier model, based on a fundamental frequency and higher harmonic frequencies, can be formed. This is done in member 4d.

The residuals of the system, in the form of the difference between digitized values of incoming currents and the model values obtained, are generated with the aid of member 4e.

The loss function $V_N$ can then be generated in member 4f in accordance with the described known technique.

Now all the necessary facts are available in order to determine whether a high resistance ground fault exists on any of the phases. In that case, it must first be determined whether there is a zero sequence current $I_0$ which is greater than a lower limit value $\nu$. Then also the loss function $V_N$, for a longer period of time $\Delta t$ than a lower limit value $t_F$, must have a value exceeding also a lower limit value $\tau$. If these conditions exist, a TRIP signal can be delivered.

In such a fault situation, it is desirable to have knowledge of what phase is the faulted one. Phase selection can be carried out transiently with the aid of the loss function and in steady state by studying the amplitude of the harmonic current harmonics.

It is also desirable to know in what direction the fault is located in relation to the measuring station. Knowledge of this can contribute to distinguish a high resistance fault from a load change, which may be useful in a complementary analysis. Knowledge of the direction to a fault may be obtained, as also described above, by the study of the polarity of the residuals after the occurence of a fault. This presupposes the existence of measuring points on both sides of the protected zone and the existence of certain communication facilities between the stations. The general rule then applies that if the currents at both measuring points are directed outwards from the protected zone, the signs of the instantaneous residuals in the faulted phases at the respective measuring points shall be the same if the fault has occurred within the zone. The same criterion of the signs also applies if both currents are directed towards the interior of the protected zone. The fault is also present within the protected zone when the signs are different and when the current at one measuring point is directed towards the interior of the protected zone and the current at the other measuring point is directed away from the measuring point. The sign is decided by integrating the residuals for a ceratin time from the moment of fault.

All of these decisions can be made within the logic unit 5. The indication delivered is given via the TRIP unit 6 with the output signal T.

Within the scope of the invention, numerous different hardware embodiments are permitted. Also, the logic sequences and decisions can be carried out in many different ways.

The principle of protection has been described for a three-phase power network, but may of course, by making minor modifications, be used in multi-phase systems as well.

We claim:

1. Protection device for high resistance ground faults in a threephase electric power distribution network, comprising:
    means for analog/digital conversion of analog signals representative of at least two phase currents and the zero sequence current of the network;
    means for analog/digital conversion of analog signals representative of each of the three phase voltages;
    means for estimation of the Fourier parameters of the converted phase current and phase voltage signals;
    means for estimation of the frequency of the electric power distribution network;
    means for the estimation of the Fourier parameters for the remaining phase current and the negative and positive sequence currents of the electric power distribution network;
    means for establishing the Fourier model of the electric power distribution network using the estimated Fourier phase currents, phase voltages, frequency and the negative and positive sequence currents;
    means for determining the instantaneous residuals of the electric power distribution network as the difference between the digitized values of said at least two phase currents and the Fourier model values;

means for establishing the instaneous loss function; and means for generating a trip signal indicating the existence of a high resistance ground fault on any of the phases of the electric power distribution network when the zero sequence current is greater than a lower limit value and simultaneously therewith said loss function has a value greater than a second lower limit value for a time longer than a lower limit time value.

2. Protection device as claimed in claim 1, wherein said means for generating a trip signal includes means for indicating those phases which have experienced at least one of a considerable change of the loss function and a considerable change of the amplitude of the current harmonics.

3. Protection device as claimed in claim 1, wherein said protection device is located at a measuring point and further comprising means for determining in the presence of a high resistance ground fault the current direction by integrating of said instantaneous residuals for a specified time from the instant of the fault to determine the signs of the residuals and said means for generating a trip signal indicates a fault signal when the signs of the residuals in the faulted phases have a predetermined relationship.

* * * * *